(12) United States Patent
Seo

(10) Patent No.: US 7,888,992 B2
(45) Date of Patent: Feb. 15, 2011

(54) CIRCUIT AND METHOD FOR CONTROLLING INTERNAL VOLTAGE

(75) Inventor: Ju-Young Seo, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1 day.

(21) Appl. No.: 12/217,050

(22) Filed: Jun. 30, 2008

(65) Prior Publication Data

US 2009/0267685 A1 Oct. 29, 2009

(30) Foreign Application Priority Data

Apr. 24, 2008 (KR) ........................ 10-2008-0038306

(51) Int. Cl.
*G05F 1/10* (2006.01)
(52) U.S. Cl. .......................... 327/541; 327/77
(58) Field of Classification Search .................... 327/72, 327/73, 77, 78, 80, 81, 143, 534, 535, 537, 327/538, 539, 540, 541, 543, 530; 323/312–317
See application file for complete search history.

(56) References Cited

U.S. PATENT DOCUMENTS

| 6,489,832 | B1 * | 12/2002 | Kim et al. ................... 327/525 |
| 6,580,258 | B2 * | 6/2003 | Wilcox et al. ................ 323/282 |
| 7,038,514 | B2 * | 5/2006 | Leith et al. ................... 327/198 |
| 7,372,245 | B2 * | 5/2008 | Ito et al. ...................... 323/316 |
| 7,436,232 | B2 * | 10/2008 | Sivero et al. ................. 327/165 |
| 7,580,306 | B2 * | 8/2009 | Cho ....................... 365/210.12 |
| 7,586,796 | B2 * | 9/2009 | Choi ...................... 365/189.09 |
| 7,746,926 | B2 * | 6/2010 | Chu et al. .................... 375/238 |
| 2007/0069808 | A1 * | 3/2007 | Do ............................. 327/541 |

FOREIGN PATENT DOCUMENTS

| KR | 10-1998-0073724 | 11/1998 |
| KR | 1020040091973 | 11/2004 |
| KR | 10-2005-0070279 | 7/2005 |

* cited by examiner

*Primary Examiner*—Lincoln Donovan
*Assistant Examiner*—Sibin Chen
(74) *Attorney, Agent, or Firm*—Blakely, Sokoloff, Taylor & Zafman

(57) ABSTRACT

A circuit for controlling an internal voltage is provided.

The circuit for controlling an internal voltage, comprising: a level detector configured to detect a voltage level of a core voltage to generate a core voltage level detection signal; a release controller configured to generate a release control signal according to the core voltage level detection signal; and a core voltage release driver configured to release the core voltage according to the release control signal.

13 Claims, 4 Drawing Sheets

CIRCUIT AND METHOD FOR CONTROLLING INTERNAL VOLTAGE

CROSS-REFERENCE(S) TO RELATED APPLICATIONS

The present invention claims priority of Korean patent application number 10-2008-0038306, filed on Apr. 24, 2008, which is incorporated by reference in its entirety.

BACKGROUND OF THE INVENTION

The present invention relates to a circuit and a method for controlling an internal voltage, and more particularly, to a circuit and a method for sensing a voltage level of an internal voltage (core voltage) and controlling a release time for the internal voltage using the sensed voltage level in a semiconductor memory device.

A semiconductor memory device receives an external power supply voltage (VDD) lower than a certain value to generate an internal voltage having a voltage level adequate for operations of an internal circuit. A memory device, such as a dynamic random access memory (DRAM), which utilizes a bit line sense amplifier, uses a core voltage (VCORE) to amplify cell data. When a word line is enabled, data in a plurality of memory cells connected to the word line are transferred to bit lines, and then the bit line sense amplifiers sense and amplify voltage difference of bit line pairs.

A voltage level for applying data to bit lines or inversion bit lines by the sense amplifier and charging a capacitor of the cell to store data in the cell in a DRAM is referred to as a core voltage level. A driver for generating the core voltage level is referred to as a core voltage driver. A gradually increased operating speed of the DRAM requires more rapid sensing, and thus the core voltage level of the cell is also required to have ability for more rapid charging.

Accordingly, there is used an overdriving for short-circuiting a core voltage level and an external power supply voltage (VDD) level, which is higher than the core voltage level, according to a current peak for operating the sense amplifier. In addition, there is also used a release driver for discharging the core voltage level in order to prevent the core voltage level from keeping a high voltage level, which is caused by the overdriving, after the overdriving.

Voltages used in the semiconductor memory device are divided to an external power supply voltage and an internal voltage such as a core voltage generated using the external power supply voltage. The internal voltage may be easily varied by internal operations of the semiconductor memory device. Particularly, if there is a possibility that the internal voltage is connected to another voltage having a higher voltage level, or if at least two voltages are connected to the same node, the two voltages may have voltage levels different from set values. This may happen frequently between the external power supply voltage and the core voltage during the operations of the semiconductor memory device.

FIG. 1 is a block diagram of a typical circuit for controlling an internal voltage.

Referring to FIG. 1, a bank controller 10 receives an activation signal RACT having a bank active/precharge information to activate an enable signal SAE1B for performing an overdriving operation on a core voltage and deactivate the enable signal SAE1B when the overdriving operation is finished. Here, the core voltage refers to a voltage generated inside the semiconductor memory device using the external power supply voltage, for use in a core region of the semiconductor memory device.

A release controller 20 receives the enable signal SAE1B deactivated by the bank controller 10 when the over driving operation is finished. Then, the release controller 20 generates a release control signal REL_CTRL for performing a release operation on a core voltage having a voltage level raised by the overdriving operation.

That is, while the enable signal SAE1B is activated to a logic low level, a voltage higher than the core voltage is applied to a core voltage terminal to perform the overdriving operation for raising the voltage level of the core voltage. The overdriving operation is performed for a short time to improve the amplifying speed of the bit line sense amplifier (BLSA).

After the overdriving operation, the core voltage level is higher than a target voltage level. Accordingly, a core voltage release operation is performed to lower the core voltage level to the target voltage level. The core voltage release operation is performed for a predetermined time, e.g., a release time TD1, after the enable signal SAE1B is deactivated to a logic high level, as shown in FIG. 2.

Therefore, while a release control signal REL_CTRL generated by a release controller 30 has a logic high level, the core voltage release driver 30 performs the discharge operation on the core voltage to lower the core voltage level that has been raised to a higher voltage level than the target voltage level by the overdriving operation. In addition, the core voltage active driver 40 is operated during an active period to raise again the core voltage level that has been lowered by the release operation of the core voltage release driver 30. Therefore, while the release control signal REL_CTRL generated by the release controller 30 has a logic high level, the core voltage release driver 30 and the core voltage active driver 40 are operated together to keep the core voltage at the target voltage level.

As described above, in the typical circuit for controlling an internal voltage, the core voltage release driver 30 and the core voltage active driver 40 are operated together for a certain period to keep the core voltage at a target voltage level. That is, while the release control signal REL_CTRL has a logic high level, the core voltage release driver 30 and the core voltage active driver 40 are operated together so that the core voltage level bounces to approach the target voltage level.

In addition, the typical circuit for controlling an internal voltage performs the release operation while the release control signal REL_CTRL has a logic high level. That is, the typical circuit for controlling an internal voltage performs the release operation for a predetermined time, e.g., for a fixed release time TD1 as shown in FIG. 2. Accordingly, even after the core voltage reached the target voltage level, the core voltage release driver 30 continues to operate until the release control signal REL_CTRL goes to a logic low level. That is, there exists a period where the core voltage release driver 30 and the core voltage active driver 40 are operated together unnecessarily, thereby increasing the current consumption. As a result, the typical circuit for controlling an internal voltage fails to consume current efficiently, resulting in an increased current consumption.

SUMMARY OF THE INVENTION

Embodiments of the present invention are directed to providing a circuit and method for controlling an internal voltage, which can control a release time by detecting a voltage level of the internal voltage after an overdriving operation is finished.

In accordance with an aspect of the present invention, there is provided a circuit for controlling an internal voltage, comprising: a level detector configured to detect a voltage level of a core voltage to generate a core voltage level detection signal; a release controller configured to generate a release control signal according to the core voltage level detection signal; and a core voltage release driver configured to release the core voltage according to the release control signal.

In accordance with another aspect of the present invention, there is provided a circuit for controlling an internal voltage, comprising: a bank controller configured to generate a first signal which is activated when an overdriving operation is finished and deactivated when a precharge signal is input, in an active period; a level detector configured to compare a voltage level of a core voltage and a voltage level of a reference voltage to generate a core voltage level detection signal, while the first signal is activated; a release controller configured to generate a release control signal according to the core voltage level detection signal, while the first signal is activated; a core voltage release driver configured to release the core voltage according to the release control signal; and a core voltage active driver configured to keep the core voltage at the target voltage level in the active period.

In accordance with still another aspect of the present invention, there is provided a method for controlling an internal voltage, the method comprising: generating a first signal which is activated when an overdriving operation is finished and deactivated when a precharge signal is input, in an active period; comparing a voltage level of a core voltage and a voltage level of a reference voltage, while the first signal is activated; activating a release control signal when the voltage level of the core voltage is higher than the voltage level of the reference voltage, while the first signal is activated; and releasing the core voltage while the release control signal is activated.

DESCRIPTION OF SPECIFIC EMBODIMENTS

Hereinafter, a circuit and method for controlling an internal voltage in accordance with the present invention will be described in detail with reference to the accompanying drawings.

Figure 1:
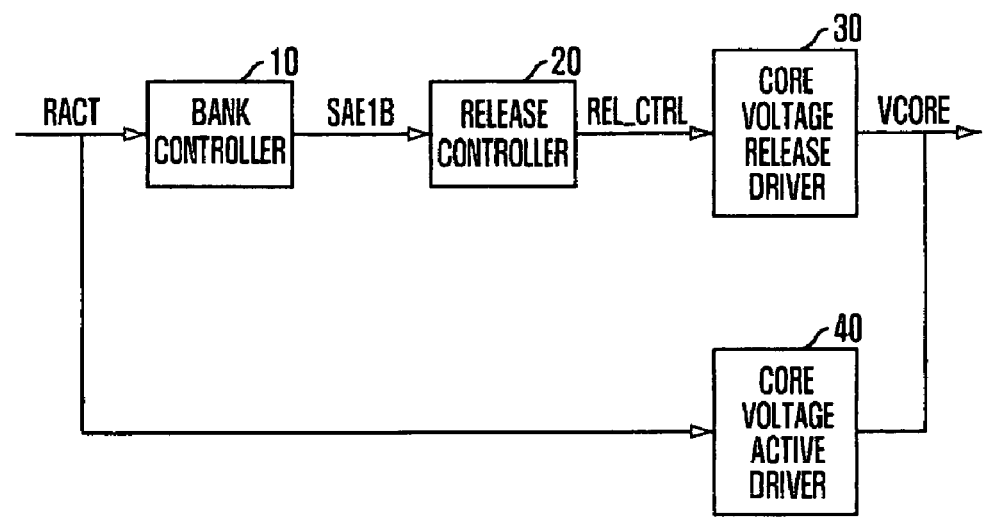
FIG. 1 is a block diagram of a typical circuit for controlling an internal voltage.
Figure 2:
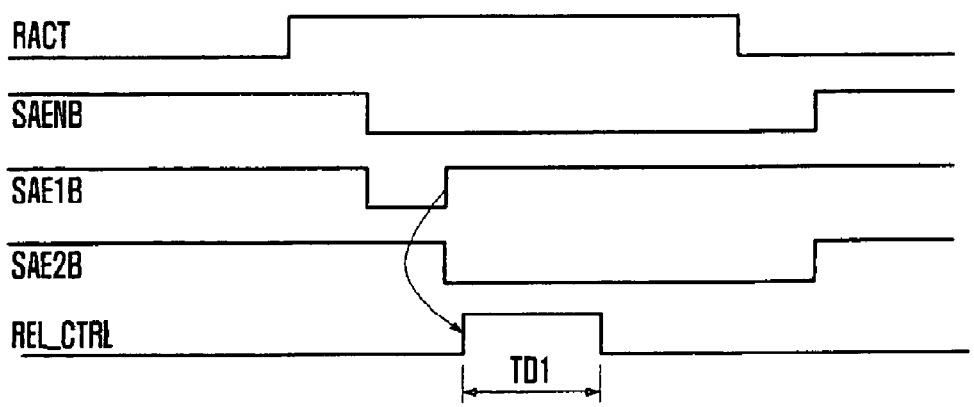
FIG. 2 is an operation timing diagram illustrating operations of the typical circuit for controlling an internal voltage of FIG. 1.
Figure 3:
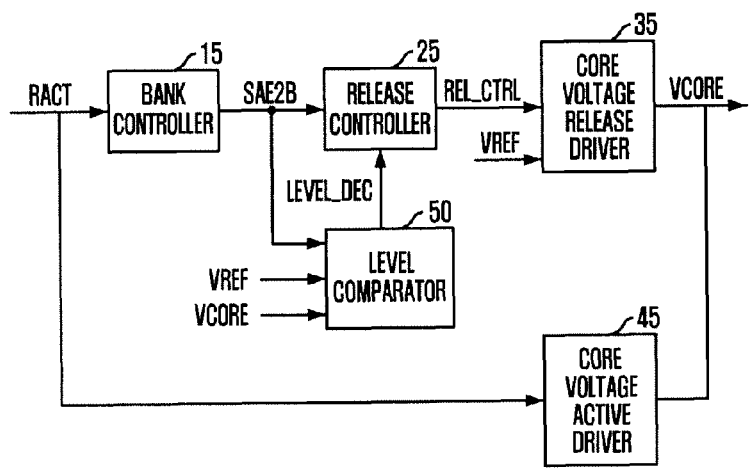
FIG. 3 is a block diagram of a circuit for controlling an internal voltage in accordance with an embodiment of the present invention.

FIG. 3 is a block diagram of a circuit for controlling an internal voltage in accordance with an embodiment of the present invention.

Referring to FIG. 3, the circuit for controlling an internal voltage includes bank controller 15, a release controller 25, a level comparator 50, a core voltage release driver 35, and a core voltage active driver 45.

The bank controller 15 receives an activation signal RACT having bank active/precharge information to generate an enable signal SAE2B, which is activated when a core voltage overdriving operation is finished and deactivated when a precharge command is input. Here, the core voltage is a voltage generated inside a semiconductor memory device using an external power supply voltage for a use in a core region of the semiconductor memory device.

The release controller 25 receives the enable signal SAE2B from the bank controller 15 when the overdriving operation is finished, to generate a release control signal REL_CTRL for performing a release operation on the core voltage which has been raised by the overdriving operation while the enable signal SAE2B is activated. That is, the release controller 25 can control the release operation while the enable signal SAE2B is activated. The release control signal REL_CTRL is generated based on a core voltage level detection signal LEVEL_DEC output from the level comparator 50.

The level comparator 50 is enabled in response to the enable signal SAE2B, which is activated when the overdriving operation is finished and deactivated when the precharge command is input. The level comparator 50 detects a voltage level difference between a reference voltage VREF generated by a reference voltage generator and a feedback voltage HVCORE of a half core voltage having ½ voltage level of the core voltage that is used in the core region, and then outputs the detection results. That is, the level comparator 50 outputs a high level signal when the voltage level of the feedback voltage HVCORE is lower than or equal to that of the reference voltage VREF, and the level comparator 50 outputs a low level signal when the voltage level of the feedback voltage HVCORE is higher than that of the reference voltage VREF.

The core voltage release driver 35 performs a discharge operation on the core voltage while the release control signal REL_CTRL generated by the release controller 25 has a logic high level. As such, the core voltage release driver 35 can lower the core voltage level which has been raised to a higher voltage level than the target voltage level by the overdriving operation. The core voltage active driver 45 is operated during an active period to raise again the core voltage level that has been lowered by the release operation of the core voltage release driver 35.

Hereinafter, the operation of the circuit for controlling an internal voltage will be described.

Figure 7:
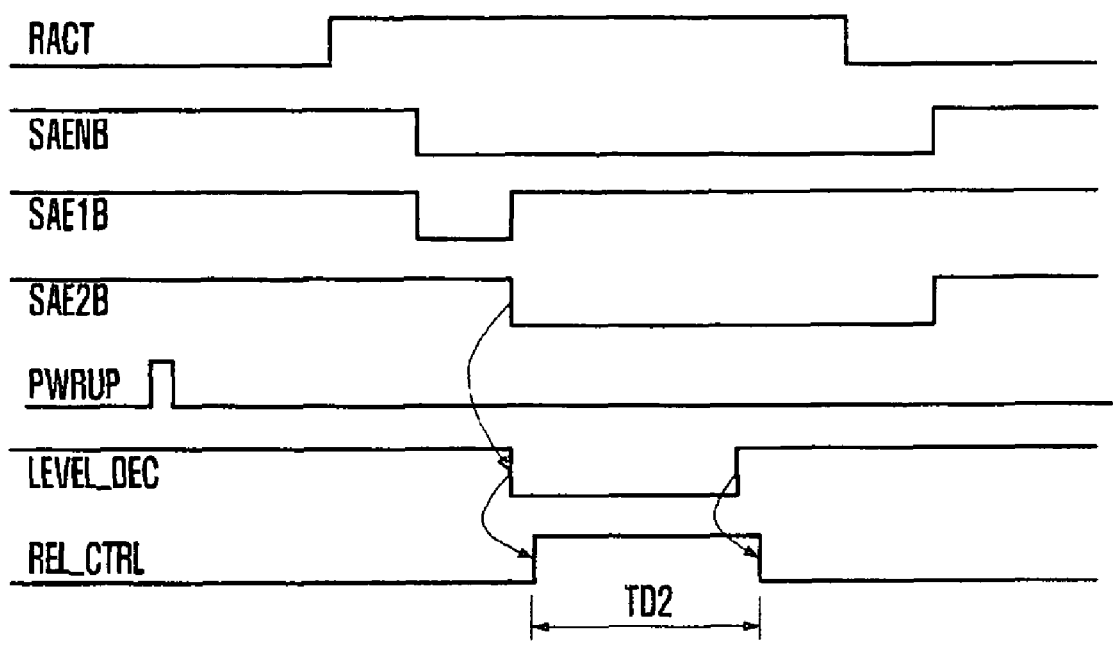
FIG. 7 is an operation timing diagram illustrating operations of the circuit for controlling an internal voltage of FIG. 3.

FIG. 7 is an operation timing diagram illustrating operations of the circuit for controlling an internal voltage of FIG. 3.

During the activation period of the activation signal RACT, which is activated when an active signal is input and deactivated when a precharge signal is input, the bank controller 15 controls the overdriving operation. The overdriving operation is performed by applying to the core voltage terminal a voltage having a voltage level higher than the core voltage level to raise the core voltage level. The overdriving operation is performed for a short time to improve the amplifying speed of the bit line sense amplifier (BLSA).

After the overdriving operation, the bank controller 15 activates the enable signal SAE2B to a logic low level. The enable signal SAE2B is activated when the overdriving operation is finished and deactivated when the precharge signal is input.

When the enable signal SAE2B is activated, the level comparator 50 starts to detect the core voltage level. That is, during the activation period of the enable signal SAE2B, the level comparator 50 detects the voltage level difference between the reference voltage VREF and the feedback voltage HVCORE. Here, the reference voltage VREF has ½ voltage level of the target core voltage, and the feedback voltage HVCORE also has ½ voltage level of the actual core voltage used in the core region. The level comparator 50 outputs a core voltage level detection signal LEVEL_DEC shown in FIG. 7, which has a logic high level when the feedback voltage HVCORE has a voltage level lower than or identical to that of the reference voltage VREF, and has a logic low level when the feedback voltage HVCORE has a voltage level higher than that of the reference voltage VREF. That is, the level comparator 50 outputs the core voltage level detection signal LEVEL_DEC during the activation period of the enable signal SAE2B, and the core voltage level detection signal LEVEL_DEC has a logic high level when the feedback voltage HVCORE has a voltage level lower than or identical to that of the reference voltage VREF and has a logic low level when the feedback voltage HVCORE has a voltage level higher than that of the reference voltage.

The core voltage level detection signal LEVEL_DEC generated by the level comparator 50 is input to the release controller 25. The release controller 25 outputs to the core voltage release driver 35 the release control signal REL_CTRL which is generated based on the core voltage level detection signal LEVEL_DEC. That is, the release controller 25 generates the release control signal REL_CTRL for performing the discharging on the core voltage while the core voltage level detection signal LEVEL_DEC has a logic low level during the activation period of the enable signal SAE2B.

Accordingly, the core voltage release driver 35 performs the release operation while the core voltage level detection signal LEVEL_DEC has a logic low level during the activation period of the enable signal SAE2B, i.e., for the release time TD2 shown in FIG. 7.

Hereinafter, the elements of the circuit for controlling an internal voltage will be described in detail.

Figure 4:
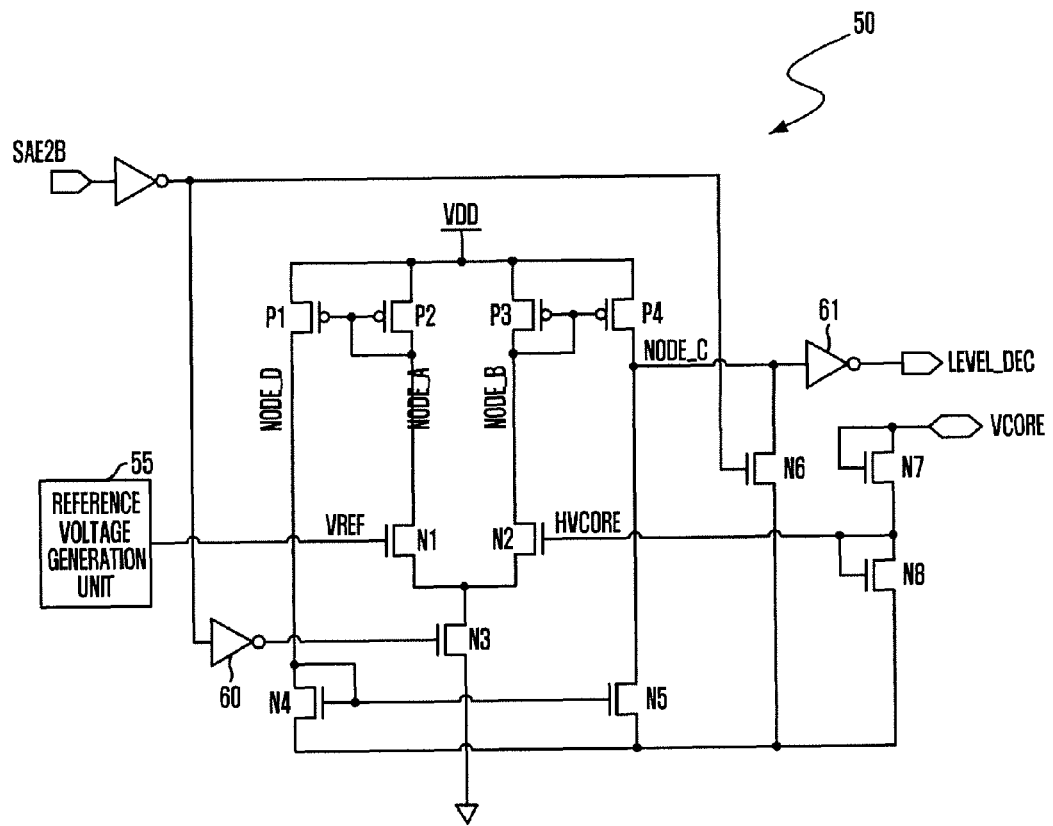
FIG. 4 is a circuit diagram of a level comparator in the circuit for controlling an internal voltage of FIG. 3.

FIG. 4 is a circuit diagram of the level comparator 50 in the circuit for controlling an internal voltage of FIG. 3.

Referring to FIG. 4, the level comparator 50 includes a differential comparison unit, a feedback voltage generation unit, and a control switch unit. The differential comparison unit differentially compares the feedback voltage HVCORE of a half core voltage having ½ voltage level of a potential at a core voltage terminal and a reference voltage VREF having ½ voltage level of a target core voltage. The feedback voltage generation unit divides the core voltage and outputs the feedback voltage HVCORE having ½ voltage level of the potential at the core voltage terminal to monitor the core voltage. The control switch unit opens and closes current paths of the differential comparison unit to enable or disable the differential comparison unit. The level comparator 50 further includes a reference voltage generation unit 55 for generating the reference voltage VREF.

The differential comparison unit includes two NMOS transistors N1 and N2 for performing differential comparison between the reference voltage VREF received from the reference voltage generation unit 55 and the feedback voltage HVCORE having ½ voltage level of the core voltage. Sources of the two NMOS transistors N1 and N2 are connected to each other through a common node. The NMOS transistor N1 receives the reference voltage VREF through a gate, and the NMOS transistor N2 receives the feedback voltage HVCORE through a gate.

The drain of the NMOS transistor N1 is connected to a PMOS transistor P2 in series through a node NODE_A. The PMOS transistor P2 receives an external power supply voltage VDD through a source. The PMOS transistor P2 forms a current mirror with another PMOS transistor P1. The current mirror controls the current at the node NODE_A.

The drain of the transistor N2 is connected to a PMOS transistor P3 in series through a node NODE_B. The PMOS transistor P3 receives the external power supply voltage VDD through a source. The PMOS transistor P3 forms a current mirror with another PMOS transistor P4. The current mirror controls the current at the node NODE_B.

An NMOS transistor N4 is connected between the PMOS transistor P1 and the ground voltage, and an NMOS transistor N5 is connected between the PMOS transistor P4 and the ground voltage. The NMOS transistors N4 and N5 also form a current mirror.

The control switch unit includes an NMOS transistor N3. The NMOS transistor N3 has a drain connected to the common node of the differential comparison unit, a gate configured to receive the enable signal SAE2B from the bank controller 15, and a source connected to the ground voltage. The enable signal SAE2B is inverted by an inverter 60 before being input to the gate of the NMOS transistor N3. As described above, the enable signal SAE2B is activated when the overdriving operation is finished and deactivated when the precharge command is input. Therefore, the control switch unit is operated only during the activation period of the enable signal SAE2B, and the duration of the operation period is approximately tens of nanoseconds.

In addition, the enable signal SAE2B is also applied to the gate of the NMOS transistor N6, which is configured to selectively mute an output signal at an output node NODE_C of the differential comparison unit.

The feedback voltage generation unit includes NMOS transistors N7 and N8 connected in series between a core voltage output terminal and the ground voltage. A node connected between the NMOS transistors N7 and N8 is connected to a gate of the NMOS transistor N2. A drain and a gate of each of the NMOS transistors N7 and N8 are connected to each other so that the NMOS transistors N7 and N8 each has the characteristics of a diode. That is, the core voltage is divided by the two NMOS transistors N7 and N8, so that the NMOS transistor N2 of the differential comparison unit may be turned on in response to the divided core voltage. The NMOS transistors N7 and N8 have the same characteristics and size.

Hereinafter, the operation of the level comparator 50 will be described.

The level comparator 50 is enabled by the enable signal SAE2B, which is activated when the overdriving operation is finished and deactivated when the precharge command is input. Accordingly, when the enable signal SAE2B is activated to a logic low level, the enable signal SAE2B is inverted to a logic high level by the inverter 60 before being input to the gate of the NMOS transistor N3. That is, while the enable signal SAE2B is activated to a logic low level, the NMOS transistor N3 is turned on to enable the differential comparison unit.

At the same time, the enable signal SAE2B of a logic low level is applied to the gate of the NMOS transistor N6 to turn off the NMOS transistor N6. Therefore, while the enable signal SAE2B is activated, the NMOS transistor N6 maintains the turn off state, and thus the core voltage level detection signal LEVEL_DEC is not affected at all.

As described above, while the enable signal SAE2B is activated, the differential comparison unit divides the actual core voltage used in the core region using the NMOS transistors N7 and N8 to form the feedback voltage HVCORE having ½ voltage level of the core voltage VCORE. Then, the differential comparison unit compares the feedback voltage HVCORE with the reference voltage VREF. The reference voltage VREF also has ½ voltage level of the target core voltage for use as a reference for comparison with the actual core voltage used in the core region.

If the reference voltage VREF and the feedback voltage HVCORE have the same voltage level, there is no difference in the voltage level between the node NODE_A and the node NODE_B in the differential comparison unit. In this case, the node NODE_C maintains the logic low level state due to of the PMOS transistor P4 and the NMOS transistor N2. Then, the logic low level signal is inverted by the inverter 61 to generate the core voltage level detection signal LEVEL_DEC of a logic high level.

If the feedback voltage HVCORE has a higher voltage level than the reference voltage VREF, the current $I_{ds}$ at the NMOS transistor N2 of the differential comparison unit is greater than that at the NMOS transistor N1. Thus, the voltage level of the node NODE_B is lower than that of the node NODE_A. Accordingly, the voltage level at the node NODE_C is raised to a logic high level and then the logic high level signal is inverted by the inverter 61 to generate the core voltage level detection signal LEVEL_DEC of a logic low level.

If the feedback voltage HVCORE has a lower voltage level than the reference voltage VREF, the current $I_{ds}$ at the NMOS transistor N2 of the differential comparison unit is smaller than that at the NMOS transistor N1. Thus, the voltage level of the node NODE_B is higher than that of the node NODE_A. Accordingly, the voltage level at the node NODE_C is lowered to a logic low level and then the logic low level signal is inverted by the inverter 61 to generate the core voltage level detection signal LEVEL_DEC of a logic high level.

That is, when the voltage level of the feedback voltage HVCORE is identical to or lower than that of the reference voltage, the core voltage level detection signal LEVEL_DEC has a logic low level as shown in FIG. 7.

Figure 5:
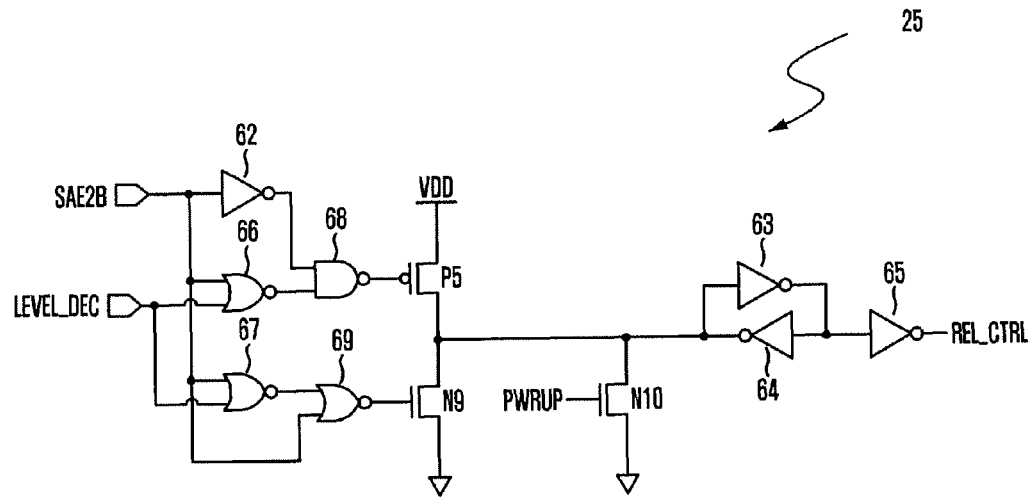
FIG. 5 is a circuit diagram of a release controller in the circuit for controlling an internal voltage of FIG. 3.

FIG. 5 is a circuit diagram of the release controller 25 in the circuit for controlling an internal voltage of FIG. 3.

Referring to FIG. 5, the release controller 25 receives the enable signal SAE2B output from the bank controller 15 and the core voltage level detection signal LEVEL_DEC output from the level comparator 50 to generate the release control signal REL_CTRL for controlling the release operation of the core voltage release driver 35.

The release controller 25 includes a first operation unit configured to generate a switching control signal for a PMOS transistor P5. The first operation unit includes an inverter 62, a NOR gate 66 and a NAND gate 68. The inverter 62 inverts the enable signal SAE2B. The NOR gate 66 performs a NOR operation on the enable signal SAE2B and the core voltage level detection signal LEVEL_DEC. The NAND gate 68 performs a NAND operation on an output signal of the inverter 62 and an output signal of the NOR gate 66.

The release controller 25 also includes a second operation unit configured to generate a switching control signal for an NMOS transistor N9. The second operation unit includes NOR gates 67 and 69. The NOR gate 67 performs a NOR operation on the enable signal SAE2B and the core voltage level detection signal LEVEL_DEC. The NOR gate 69 performs a NOR operation on the enable signal SAE2B and an output signal of the NOR gate 67.

The PMOS transistor P5 and the NMOS transistor N9 are connected in series between the power supply voltage VDD and the ground voltage. The PMOS transistor P5 and the NMOS transistor N9 are turned on/off in response to the output signals of the first and second operation units, respectively. That is, the PMOS transistor P5 and the NMOS transistor N9 are connected between the power supply voltage and the ground voltage to function as a pull-up switch and a pull-down switch, respectively. Therefore, the switching control signal of the PMOS transistor P5 functions as a pull-up control signal for the PMOS transistor P5 which functions as a pull-up switch. Similarly, the switching control signal of the NMOS transistor N9 functions as a pull-down control signal for the NMOS transistor N9 which functions as a pull-down switch.

Output signal of the PMOS transistor P5 and the NMOS transistor N9 passes through a latch including inverters 63 and 64 and an inverter 65 to generate the release control signal REL_CTRL. Between an output terminal of the transistors P5 and N9 and the ground terminal, an NMOS transistor N10 is connected to determine the operation point of the release controller 25. The NMOS transistor N10 is enabled in response to a power up signal PWRUP.

Hereinafter, the operation of the release controller 25 will be described.

The release controller 25 generates the release control signal REL_CTRL for determining an actual release operation period. When the NMOS transistor N10 is turned on in response to the power up signal PWRUP, which has a high pulse at an early stage as shown in FIG. 7, the latch receives a signal having a ground voltage level, i.e., a low level signal. The low level signal passes through the latch including the inverters 63 and 64 and the inverter 65 to generate the release control signal REL_CTRL. Accordingly, in a precharge mode, the release controller 25 always output the release control signal REL_CTRL of a logic low level.

A releasable period where the release period can be determined is the period where the enable signal SAE2B is activated to a logic low level. While the enable signal SAE2B maintains a logic low level state, if the overdriving operation is finished and the core voltage maintains the raised voltage level, the core voltage level detection signal LEVEL_DEC has a logic low level (see FIG. 4).

In this case, the inverter 62 receives the enable signal SAE2B of a logic low level to output a high level signal as a first input signal to the NAND gate 68. The NOR gate 66 receives the enable signal SAE2B of a logic low level and the core voltage level detection signal LEVEL_DEC of a logic low level to output a high level signal as a second input signal to the NAND gate 68. Then, the NAND gate 68 outputs a low level signal to turn on the PMOS transistor P5 so that a high level signal is output through the PMOS transistor P5. Here, the NMOS transistor N9 is turned off.

The high level signal passes through the latch including the inverters 63 and 64 and the inverter 65 to generate the release control signal REL_CTRL. As a result, the release controller 25 outputs the release control signal REL_CTRL of a logic high level to the core voltage release driver 35, so that the core voltage release driver 35 performs the release operation.

When the voltage level of the core voltage becomes identical to that of the target voltage level by the release operation of the core voltage release driver 35, the core voltage level detection signal LEVEL_DEC goes to a logic high level, again (see FIG. 4).

In this case, the inverter 62 receives the enable signal SAE2B of a logic low level to output a high level signal as a first input signal to the NAND gate 68. The NOR gate 66 receives the enable signal SAE2B of a logic low level and the core voltage level detection signal LEVEL_DEC of a logic high level to output a low level signal as a second input signal to the NAND gate 68. Then, the NAND gate 68 outputs a high level signal to turn off the PMOS transistor P5.

In addition, the NOR gate 67 receives the enable signal SAE2B of a logic low level and the core voltage level detection signal LEVEL_DEC of a logic high level to output a low level signal. Then, the NOR gate 69 receives the low level signal from the NOR gate 67 and the enable signal SAE2B of a logic low level to output a high level signal. Consequently, the NMOS transistor N9 is turned on in response to the high level signal output from the NOR gate 69.

As a result, a low level signal is output from the transistors P5 and N9. The low level signal passes through the latch including the inverters 63 and 64 and the inverter 65 to generate the release control signal REL_CTRL. As a result, the release controller 25 outputs the release control signal REL_CTRL of a logic low level to the core voltage release driver 35, so that the core voltage release driver 35 finishes the release operation.

As described above, the core voltage release driver 35 performs the core voltage release operation while the release controller 25 outputs the high level signal. The core voltage release operation is finished when the output signal of the release controller 25 goes to a logic low level. Here, the enable signal SAE2B of a logic low level (releasable period) is deactivated to a logic high level in response to the precharge command.

In this case, the enable signal SAE2B of a logic high level passes through the inverter 62 and the NAND gate 68 to generate a high level signal, and thus to turn off the PMOS transistor P5. Similarly, the enable signal SAE2B of a logic high level passes through the NOR gate 69 to generate a low level signal, and thus to turn off the NMOS transistor N9. Then, a low level signal is output from the transistors P5 and N9, and then passes through the latch including the inverters 63 and 64 and the inverter 65, so that the release control signal REL_CTRL of a logic low level is output from the release controller 25.

Figure 6:
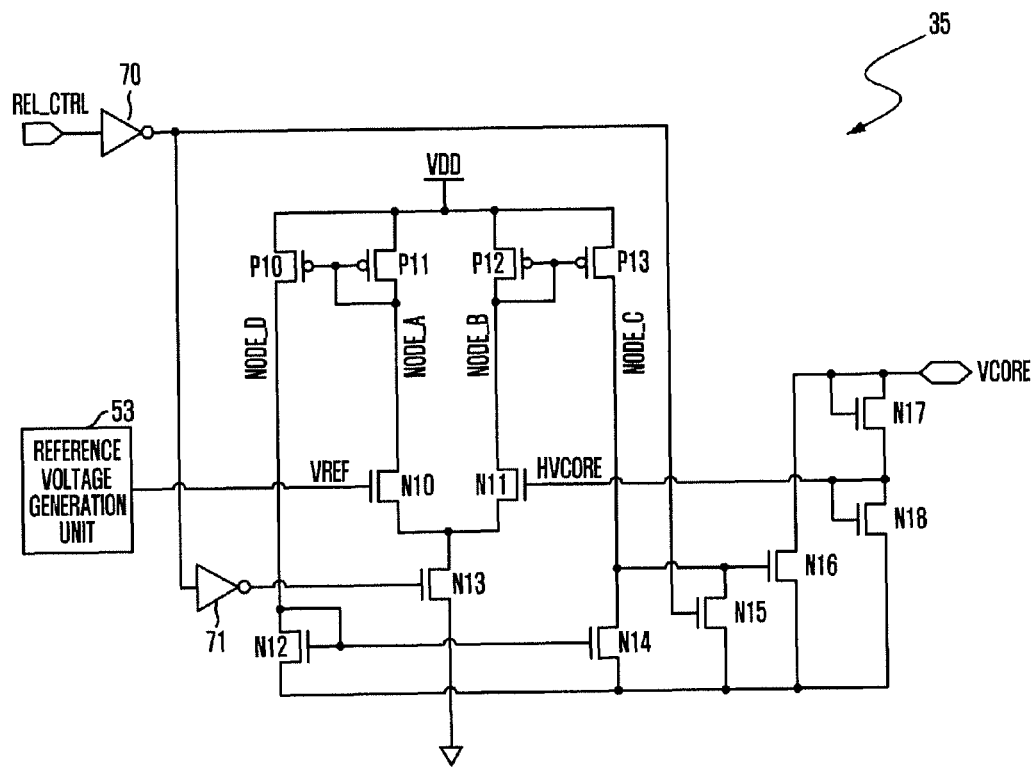
FIG. 6 is a circuit diagram of a core voltage release driver in the circuit for controlling an internal voltage of FIG. 3.

FIG. 6 is a circuit diagram of the core voltage release driver 35 in the circuit for controlling an internal voltage of FIG. 3.

Referring to FIG. 6, the core voltage release driver 35 includes a differential comparison unit, a feedback voltage generation unit, and a control switch unit. The differential comparison unit differentially compares the feedback voltage HVCORE of a half core voltage having ½ voltage level of a potential at a core voltage terminal and a reference voltage VREF having ½ voltage level of a target core voltage. The feedback voltage generation unit divides the core voltage and outputs the feedback voltage HVCORE having ½ voltage level of the potential at the core voltage terminal to monitor the core voltage. The control switch unit opens and closes current paths of the differential comparison unit to enable or disable the differential comparison unit. The core voltage release driver 35 further includes a reference voltage generation unit 53 for generating the reference voltage VREF. In addition, the core voltage release driver 35 further includes a discharge unit for discharging the core voltage when the output core voltage has a higher voltage level than the target voltage level.

The differential comparison unit includes two NMOS transistors N10 and N11 for performing differential comparison between the reference voltage VREF received from the reference voltage generation unit 53 and the feedback voltage HVCORE having ½ voltage level of the core voltage. Sources of the two transistors N10 and N11 are connected to each other through a common node. Accordingly, the transistor N10 receives the reference voltage VREF through a gate, and the transistor N11 receives the feedback voltage HVCORE through a gate.

The drain of the transistor N10 is connected to a PMOS transistor P11 in series through a node NODE_A. The PMOS transistor P11 receives the external power supply voltage VDD through a source. The PMOS transistor P11 forms a current mirror with another PMOS transistor P10. The current mirror controls the currents at the nodes NODE_A and NODE_D.

The drain of the transistor N11 is connected to a PMOS transistor P12 in series through a node NODE_B. The PMOS transistor P12 receives the external power supply voltage VDD through a source. The PMOS transistor P12 forms a current mirror with another PMOS transistor P13. The current mirror controls the currents at the nodes NODE_B and NODE_C.

An NMOS transistor N12 is connected between the PMOS transistor P10 and the ground voltage, and an NMOS transistor N14 is connected between the PMOS transistor P13 and the ground voltage. The NMOS transistors N12 and N14 also form a current mirror.

The control switch unit includes an NMOS transistor N13. The NMOS transistor N13 has a drain connected to the common node of the differential comparison unit, a gate configured to receive the release control signal REL_CTRL from the release controller 25, and a source connected to the ground voltage. The release control signal REL_CTRL is applied to the gate of the NMOS transistor N13 through two inverters 70 and 71.

In addition, the release control signal REL_CTRL is also applied to the gate of the NMOS transistor N15 through the inverter 70. The NMOS transistor N15 is configured to selectively mute an output signal of an output node NODE_C of the differential comparison unit.

The feedback voltage generation unit includes NMOS transistors N17 and N18 connected in series between a core voltage output terminal and the ground voltage. A node connected between the NMOS transistors N17 and N18 is connected to a gate of the NMOS transistor N11. A drain and a gate of each of the NMOS transistors N17 and N18 are connected to each other. The NMOS transistors N17 and N18 have the same size and characteristics. That is, the core voltage is divided by the two NMOS transistors N17 and N18, so that the NMOS transistor N11 of the differential comparison unit may be turned on in response to the divided core voltage.

The discharge unit includes an NMOS transistor N16 with a gate connected to the output node of the differential comparison unit. A source of the NMOS transistor N16 is connected to the ground terminal and a drain thereof is connected to the core voltage output terminal. Accordingly, the voltage level input to the drain of the NMOS transistor 16 is varied with the voltage level of the output node of the differential comparison unit.

Hereinafter, the operation of the core voltage release driver 35 will be described.

The core voltage release driver 35 is enabled when the release control signal REL_CTRL is activated to a logic high level. Accordingly, when the release control signal REL_CTRL has a logic high level, the release control signal REL_CTRL passes through the inverters 70 and 71 so that a high level signal is input to the gate of the NMOS transistor N13, thereby turning on the NMOS transistor N13. As the NMOS transistor N13 is turned on, the differential comparison unit can be enabled.

At the same time, a low level signal, which is an inverted signal of the release control signal REL_CTRL of a logic high level, is applied to the gate of the NMOS transistor N15 to turn off the NMOS transistor N15. That is, the output signal of the differential comparison unit is not affected by the operation of the NMOS transistor N15 and thus can be output normally.

As described above, while the release control signal REL_CTRL is activated, the differential comparison unit divides the actual core voltage used in the core region using the NMOS transistors N17 and N18 to form the feedback voltage HVCORE having ½ voltage level of the core voltage VCORE. Then, the differential comparison unit compares the feedback voltage HVCORE with the reference voltage VREF. The reference voltage VREF also has ½ voltage level of the target core voltage for use as a reference for comparison with the actual core voltage used in the core region.

If the feedback voltage HVCORE has a higher voltage level than the reference voltage VREF, the current $I_{ds}$ at the NMOS transistor N11 in the differential comparison unit is greater than that at the NMOS transistor N10. Thus, the voltage level of the node NODE_B is lower than that of the node NODE_A. Accordingly, the voltage level at the node NODE_C is raised to a logic high level and then the high level signal turns on the NMOS transistor N16.

As the NMOS transistor is turned on, the operation of lowering the core voltage level is performed, which has been raised by the overdriving operation.

Thereafter, if the core voltage level is lowered so that the reference voltage VREF and the feedback voltage HVCORE have the same voltage level, there is no voltage level difference between the node NODE_A and the node NODE_B in the differential comparison unit. In this case, the node NODE_C maintains the logic low level state due to the PMOS transistor P13 and the NMOS transistor N14. Then, the logic low level signal turns off the NMOS transistor N15 so that the release operation of the core voltage release driver 35 cannot be performed.

That is, the overdriving operation according to the turning on of the NMOS transistor N16 is performed until the voltage level of the feedback voltage HVCORE becomes identical to that of the reference voltage VREF. In addition, the release time TD2 is determined based on the voltage level of the core voltage. Accordingly, the voltage level of the core voltage is lowered by the core voltage release driver 35 when the feedback voltage HVCORE has a voltage level higher than the reference voltage VREF for the release time TD2 which is determined based on the voltage level of the core voltage.

As described above, according to the exemplary embodiments, the voltage level of the core voltage is lowered by the core voltage release driver 35 when the feedback voltage HVCORE has a voltage level higher than the reference voltage VREF for the release time which is determined based on the voltage level of the core voltage. Therefore, by reducing time for operating the active driver and the release driver together, it is possible to reduce the total current consumption. In addition, by efficiently controlling the discharging amount of the core voltage according to the voltage level of the core voltage, it is possible to allow the core voltage is stably maintained at the target voltage level.

While the present invention has been described with respect to the specific embodiments, it will be apparent to those skilled in the art that various changes and modifications may be made without departing from the spirit and scope of the invention as defined in the following claims.

What is claimed is:

1. A circuit for controlling an internal voltage in a semiconductor device having an active period and a precharge period, comprising:
    a level detector configured to detect a voltage level of a core voltage during a second period of the active period in response to an enable signal, and to generate a core voltage level detection signal;
    a release controller configured to generate a release control signal according to the core voltage level detection signal; and
    a core voltage release driver configured to release the core voltage according to the release control signal,
    wherein the active period comprises a first period for an overdriving operation to a core voltage terminal, and the second period between a finish of the first period and a start of the precharge period, and
    the level detector generates the core voltage level detection signal, when the voltage level of the core voltage is higher than the reference voltage,
    wherein a pulse width of the release control signal is determined based on the core voltage level detection signal, and
    the release controller comprises:
    a first operation unit configured to perform an operation on the enable signal and the core voltage level detection signal to generate a pull up control signal;
    second operation unit configured to perform an operation on the enable signal and the core voltage level detection signal to generate a pull down control signal;
    a pull up/down switch unit configured to be selectively operated by the pull up control signal and the pull down control signal to determine an output voltage level of the release control signal; and
    a latch unit configured to latch an output signal of the pull up/down switch unit.

2. The circuit of claim 1, wherein the level detector comprises a comparison unit configured to compare the voltage level of the core voltage and a voltage level of the reference voltage to activate the core voltage level detection signal.

3. The circuit of claim 2, wherein the level detector further comprises a control switch unit configured to control an operation point of the comparison unit while the enable signal is activated.

4. The circuit of claim 3, wherein the level detector further comprises a voltage divide unit configured to divide the core voltage input to the comparison unit.

5. The circuit of claim 1, wherein the level detector comprises a comparison unit configured to compare the core voltage and the reference voltage to deactivate the core voltage level detection signal when the core voltage is identical to or lower than the reference voltage.

6. The circuit of claim 1, wherein the first operation unit comprises:
    an inverter configured to invert the enable signal;
    a NOR gate configured to perform a NOR operation on the enable signal and the core voltage level detection signal; and
    a NAND gate configured to perform a NAND operation on an output signal of the inverter and an output signal of the NOR gate.

7. The circuit of claim 1, wherein the second operation unit comprises:
    a first NOR gate configured to perform a NOR operation on the enable signal and the core voltage level detection signal; and
    a second NOR gate configured to perform a NOR operation on an output signal of the first NOR gate and the enable signal.

8. The circuit of claim 1, wherein the core voltage release driver comprises a comparator configured to compare the voltage level of the core voltage and a voltage level of a reference voltage to output a control signal for controlling a core voltage discharge operation when the voltage level of the core voltage is higher than that of the reference voltage.

9. The circuit of claim 8, wherein the comparator is configured to output a control signal for disabling the core voltage discharge operation when the voltage level of the core voltage is identical to or lower than the voltage level of the reference voltage.

10. The circuit of claim 9, wherein the core voltage release driver further comprises a control switch unit configured to control an operation point of the comparator while the release control signal is activated.

11. The circuit of claim 10, wherein the core voltage release driver further comprises a voltage divide unit configured to divide the core voltage input to the comparator.

12. The circuit of claim 8, wherein the core voltage release driver further comprises a control switch unit configured to control an operation point of the comparator while the release control signal is activated.

13. The circuit of claim 12, wherein the core voltage release driver further comprises a voltage divide unit configured to divide the core voltage input to the comparator.

* * * * *